US005581262A

United States Patent [19]
Kawahata et al.

[11] Patent Number: 5,581,262
[45] Date of Patent: Dec. 3, 1996

[54] SURFACE-MOUNT-TYPE ANTENNA AND MOUNTING STRUCTURE THEREOF

[75] Inventors: Kazunari Kawahata, Kyoto; Kazuhisa Yamaki, Muko, both of Japan

[73] Assignee: Murata Manufacturing Co., Ltd., Japan

[21] Appl. No.: 384,126

[22] Filed: Feb. 6, 1995

[30] Foreign Application Priority Data

Feb. 7, 1994 [JP] Japan .................................... 6-013577

[51] Int. Cl.$^6$ ........................................................ H01Q 1/38
[52] U.S. Cl. ........................................ 343/700 MS; 343/873
[58] Field of Search ........................... 343/700 MS, 702, 343/846, 873; H01Q 1/27, 1/40, 1/26

[56] References Cited

U.S. PATENT DOCUMENTS

| | | | |
|---|---|---|---|
| 3,155,975 | 11/1964 | Chatelain | 343/873 |
| 4,806,941 | 2/1989 | Knochel et al. | 343/700 MS |
| 4,987,425 | 1/1991 | Zahn et al. | 343/702 X |
| 5,061,938 | 10/1991 | Zahn et al. | 343/700 MS |
| 5,200,756 | 4/1993 | Feller | 343/700 MS |
| 5,272,485 | 12/1993 | Mason et al. | 343/700 MS |
| 5,337,065 | 8/1994 | Bonnet et al. | 343/700 MS |
| 5,442,366 | 8/1995 | Sanford | 343/700 MS |

*Primary Examiner*—Donald T. Hajec
*Assistant Examiner*—Tho Phan
*Attorney, Agent, or Firm*—Ostrolenk, Faber, Gerb & Soffen, LLP

[57] ABSTRACT

A surface-mount-type antenna that is capable of being surface-mounted on a printed circuit board includes a dielectric substrate, a through-hole formed within the dielectric substrate and having its openings in opposed side surfaces of the dielectric substrate, a radiation electrode formed in the inner periphery of the through-hole, a feeding electrode, and side electrodes formed on the side surfaces in which the through-hole has its openings. The antenna can be placed on a printed circuit board having an electrode pattern, and the feeding electrode and the electrode pattern can be soldered together to thereby surface-mount the antenna on the printed circuit board.

14 Claims, 5 Drawing Sheets

SURFACE-MOUNT-TYPE ANTENNA AND MOUNTING STRUCTURE THEREOF

BACKGROUND OF THE INVENTION

1. Field of the Invention

The present invention relates to a surface-mount-type antenna and a mounting structure thereof for use in mobile communication equipment and the like.

2. Description of the Related Art

FIG. 7 shows a form of communication apparatus 60, such as a portable telephone, using a conventional dielectric-loaded antenna 56. Numeral 51 indicates a cylindrical dielectric base. A through-hole 52 is formed so as to extend along the longitudinal dimension of the dielectric base 51. A radiation electrode 53 consisting, for example, of Cu, is formed in the inner periphery of the through-hole 52. A surface electrode 54 connected to the radiation electrode 53 is formed so as to entirely cover one end surface of the dielectric base 51. A male connector 55 is attached to the other end surface of the dielectric base 51 to complete a dielectric-loaded antenna 56. When the male connector 55 is connected to a female connector 61 provided on the body of a communication apparatus 60, it is possible for the radiation electrode 53 to be supplied with electricity and to transmit and receive high-frequency signals.

In the above-described conventional communication apparatus, the dielectric-loaded antenna 56 is arranged outside the body of the communication apparatus 60. This arrangement constitutes an obstacle to miniaturization of the communication apparatus. Further, external forces are allowed to directly act on the antenna. Thus, this conventional structure is subject to deterioration in mechanical strength and durability, fluctuations in characteristics, etc. Moreover, since the high-frequency signals are transmitted and received through connectors, an increase in insertion loss, fluctuations in resonance frequency, etc. are generated. In addition, the use of connectors leads to an increase in the number of parts, and is not desirable from the viewpoint of operability and cost.

SUMMARY OF THE INVENTION

The present invention has been made with a view toward solving the above problems in the prior art. It is an object of the present invention to provide a surface-mount-type antenna that is capable of being surface-mounted on a printed circuit board. The present invention also aims to provide a mounting structure for such a surface-mount-type antenna.

The above objects may be achieved by the invention disclosed and claimed herein.

In accordance with one aspect of the present invention, a surface-mount-type antenna may comprise: a dielectric substrate; a radiation electrode formed on the dielectric substrate; and a feeding electrode electrically connected to the radiation electrode and formed on a side surface of the dielectric substrate.

The above-mentioned radiation electrode may be formed in the interior of the dielectric substrate in such a way as to be parallel to the surface of the dielectric substrate.

Further, a through-hole may be formed in the interior of the dielectric substrate in such a way as to be parallel to the surface of the dielectric substrate, the radiation electrode being formed in the inner periphery of the through-hole.

In another aspect of the present invention, there is provided a surface-mount-type antenna comprising: a dielectric substrate; a radiation electrode formed on a side surface of the dielectric substrate; and a feeding electrode electrically connected to said radiation electrode, and formed at an end of a side surface that is perpendicular to the side surface on which the radiation electrode is formed.

The above-described surface-mount-type antennas may be placed on a printed circuit board having an electrode pattern, and the feeding electrode of the surface-mount-type antenna may be joined to the electrode pattern of the printed circuit board.

In a still further aspect of the present invention, there is provided a surface-mount-type antenna comprising: a dielectric substrate; a radiation electrode formed on a side surface of the dielectric substrate; and a feeding electrode electrically connected to the radiation electrode and formed on a side surface that is perpendicular to the side surface on which the radiation electrode is formed.

The just-mentioned surface-mount-type antenna may be placed on a printed circuit board having an electrode pattern and a grounding electrode, and the feeding point of the radiation electrode of the surface-mount-type antenna may be joined to the electrode pattern of the printed circuit board, the ground electrode of the surface-mount-type antenna being joined to the grounding electrode of the printed circuit board.

All of the above-described surface-mount-type antennas may be mounted on the printed circuit board in such a way that the direction of a high-frequency current flowing through the radiation electrode is parallel to the surface of printed circuit board.

In the antenna structures described above, the feeding electrode, which is connected to the radiation electrode, is formed on a side surface of the antenna, so that the feeding electrode and the electrode pattern of the printed circuit board may be connected to each other, thereby enabling the antenna to be surface-mounted on the printed circuit board. Therefore, it is possible for the antenna and the associated communication apparatus to be connected through the shortest possible distance without using any connector.

DESCRIPTION OF PREFERRED EMBODIMENTS OF THE INVENTION

Figure 1:
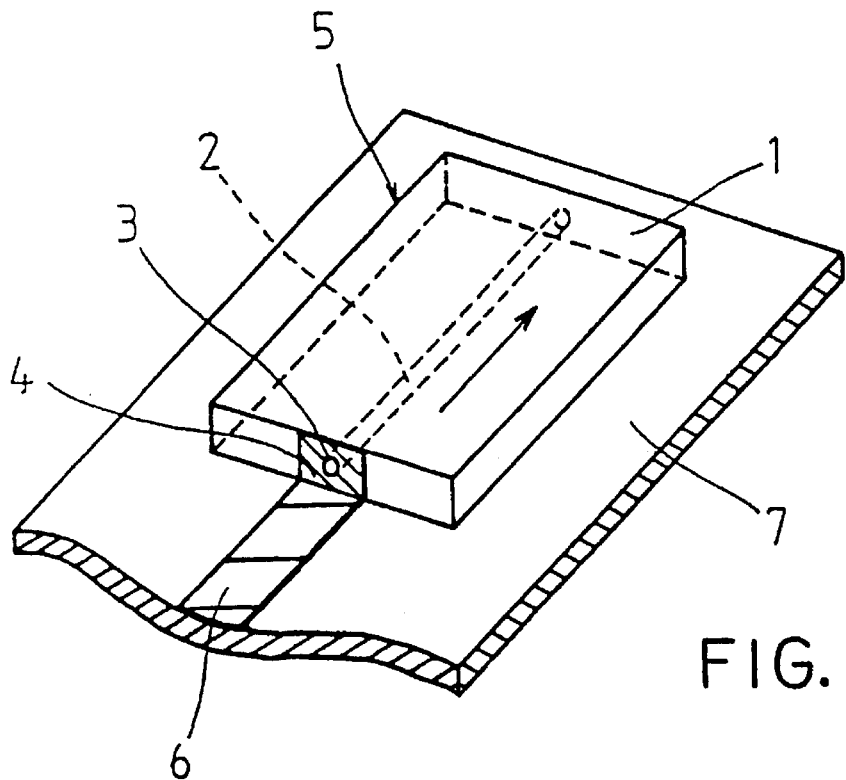
FIG. 1 is a perspective view showing a surface-mount-type antenna according to a first embodiment of the present invention and a mounting structure for the antenna.

Surface-mount-type antennas according to embodiments of the present invention will now be described with reference to FIGS. 1 through 6. FIG. 1 shows an antenna 5, which comprises: a dielectric substrate 1; a through-hole 2 formed in the dielectric substrate 1 and having its openings in opposed side surfaces of the dielectric substrate 1; a radiation electrode 3 formed in the inner periphery of the through-hole 2; and a feeding electrode 4 formed on one of the opposed side surfaces in which the through-hole 2 has its openings and electrically connected to the radiation electrode 3. The antenna 5 is placed on a printed circuit board 7 having an electrode pattern 6, and the feeding electrode 4 and the electrode pattern 6 are soldered together, thereby surface-mounting the antenna 5 on the printed circuit board 7. As indicated by the arrow, the high frequency current flowing through the radiation electrode 3 flows parallel to the surface of the printed circuit board 7.

The antenna 5 can be fastened to the printed circuit board 7 by attaching the reverse side of the dielectric substrate 1 to the obverse side of the printed circuit board 7 by means of an adhesive. It is also possible to form a stationary electrode (not shown) on the reverse side of the dielectric substrate 1 or on an area extending from the reverse side to a side surface of the dielectric substrate 1 and, at the same time, form a holding electrode (not shown) on the obverse side of the printed circuit board, at a position opposed to the stationary electrode of the antenna 5, soldering the stationary electrode of the antenna 5 and the holding electrode of the printed circuit board 7 to each other, thereby fastening the antenna 5 to the printed circuit board 7.

Figure 2:
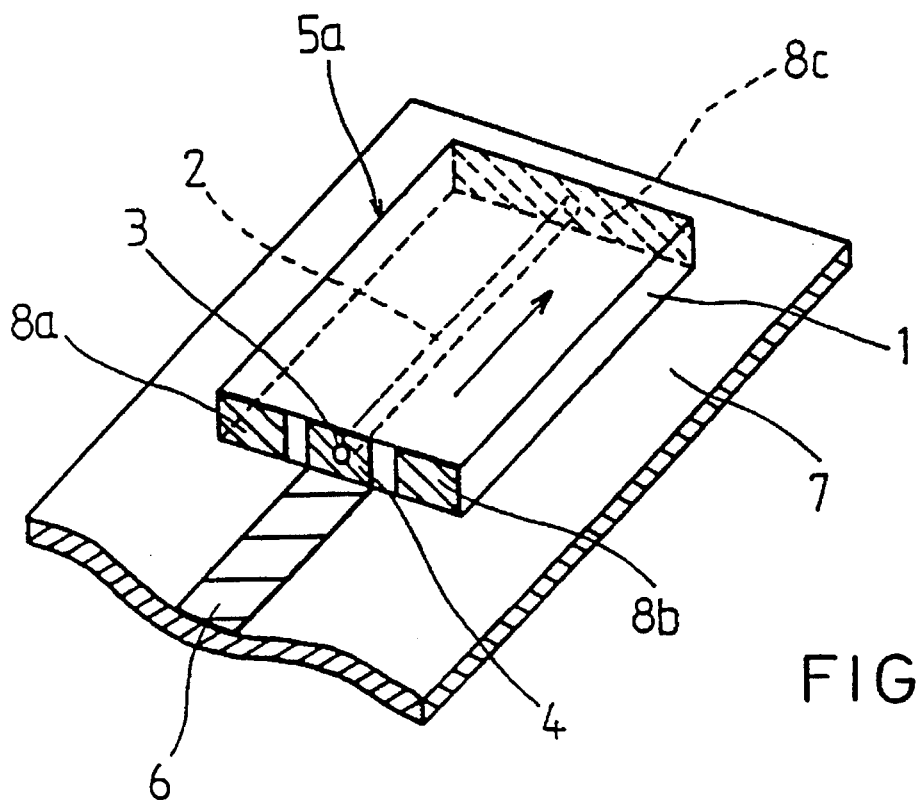
FIG. 2 is a perspective view showing a surface-mount-type antenna according to a second embodiment of the present invention and a first mounting structure for the antenna.

FIG. 2 shows an antenna 5a having side electrodes 8a, 8b and 8c that are formed on the side surfaces where the through-hole 2 of the dielectric substrate 1 has its openings. The side electrodes 8a and 8b are electrically insulated from the feeding electrode 4. The side electrode 8c is electrically connected to the radiation electrode 3. A capacitance component is provided between the side electrodes 8a and 8c and between the side electrodes 8b and 8c. Due to this capacitance component, it is possible to reduce the resonance frequency of the antenna 5a or diminish the outer dimensions thereof.

Figure 3:
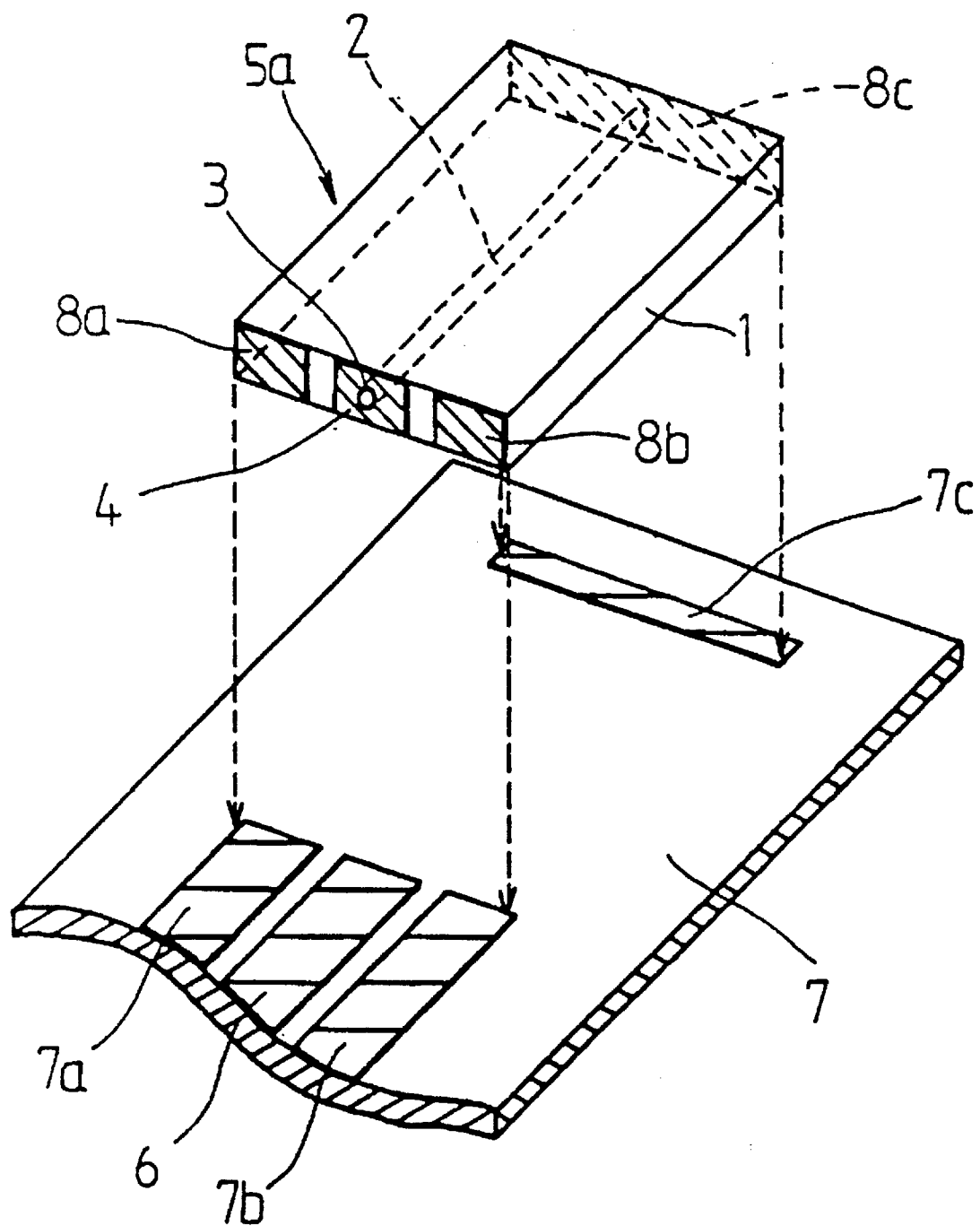
FIG. 3 is a perspective view showing a surface-mount-type antenna according to the second embodiment of the present invention and a second mounting structure for the antenna.

The antenna 5a can be fastened to the printed circuit board 7 by attaching the reverse side of the dielectric substrate 1 to the obverse side of the printed circuit board 7 by means of an adhesive. It is also possible, as shown in FIG. 3, to form grounding electrodes 7a and 7b and a holding electrode 7c on the printed circuit board 7 and to solder the side electrodes 8a, 8b and 8c of the antenna 5a to the grounding electrodes 7a and 7b and the holding electrode 7c, respectively, of the printed circuit board 7 to thereby fasten the antenna 5a to the printed circuit board 7.

Figure 4:
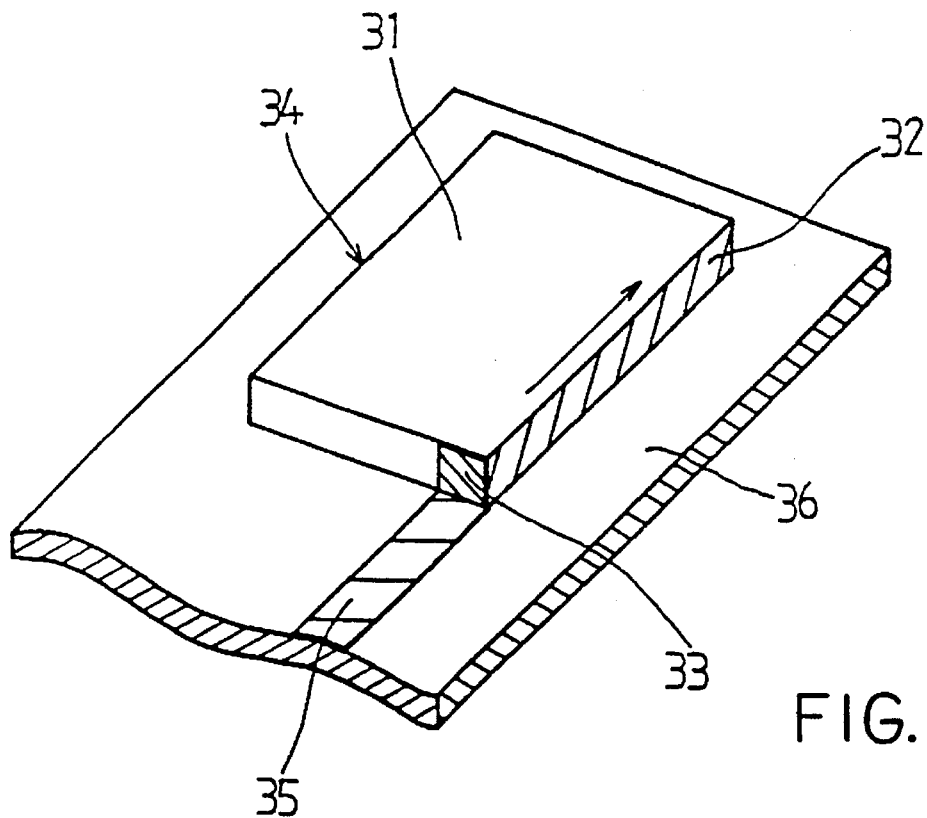
FIG. 4 is a perspective view showing a surface-mount-type antenna according to a third embodiment of the present invention and a mounting structure for the antenna.

FIG. 4 shows an antenna 34 comprising: a dielectric substrate 31; a radiation electrode 32 formed on a longer side of the dielectric substrate 31; and a feeding electrode 33 formed at an end of a shorter side of the dielectric substrate 31 and electrically connected to the radiation electrode 32. The antenna 34 is placed on a printed circuit board 36 having an electrode pattern 35, and the feeding electrode 33 and the electrode pattern 35 are soldered to each other to thereby surface-mount the antenna 34 on the printed circuit board 36. As indicated by the arrow, the high-frequency current flowing through the radiation electrode 32 flows parallel to the surface of the printed circuit board 36.

Figure 5:
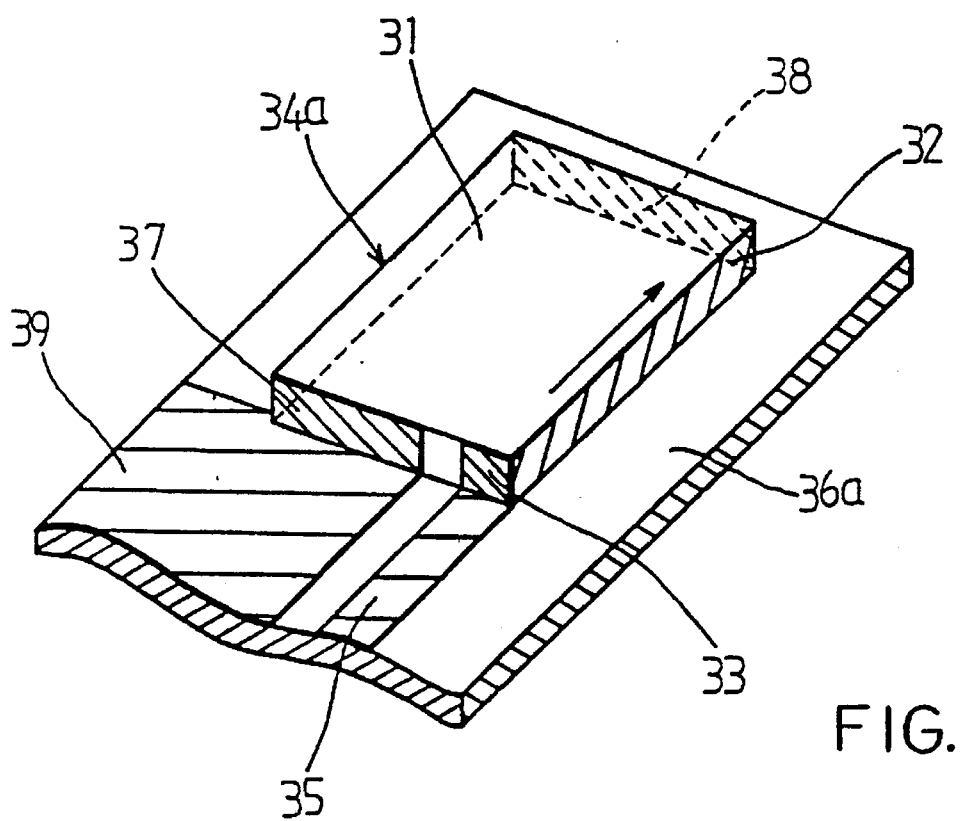
FIG. 5 is a perspective view showing a surface-mount-type antenna according to a fourth embodiment of the present invention and a mounting structure for the antenna.

FIG. 5 shows an antenna 34a comprising: a dielectric substrate 31; a radiation electrode 32; a feeding electrode 33 formed on a side surface of the dielectric substrate; a side electrode 37 formed on that side surface of the dielectric substrate 31 on which the feeding electrode 33 is formed and electrically insulated from the feeding electrode 33; a side electrode 38 formed on the side surface opposite to the side electrode 37 and electrically connected to the radiation electrode 32. The antenna 34a is placed on a printed circuit board 36a having an electrode pattern 35 and a grounding electrode 39. The feeding electrode 33 and the electrode pattern 35 are soldered to each other, and the side electrode 37 and the grounding electrode 39 are soldered to each other, thereby surface-mounting the antenna 34a on the printed circuit board 36a. In this case, as in the antenna 5a shown in FIG. 2, a capacitance component is formed between the side electrodes 37 and 38, whereby the resonance frequency of the antenna 34a can be reduced, or the outer dimensions thereof can be diminished.

Figure 6:
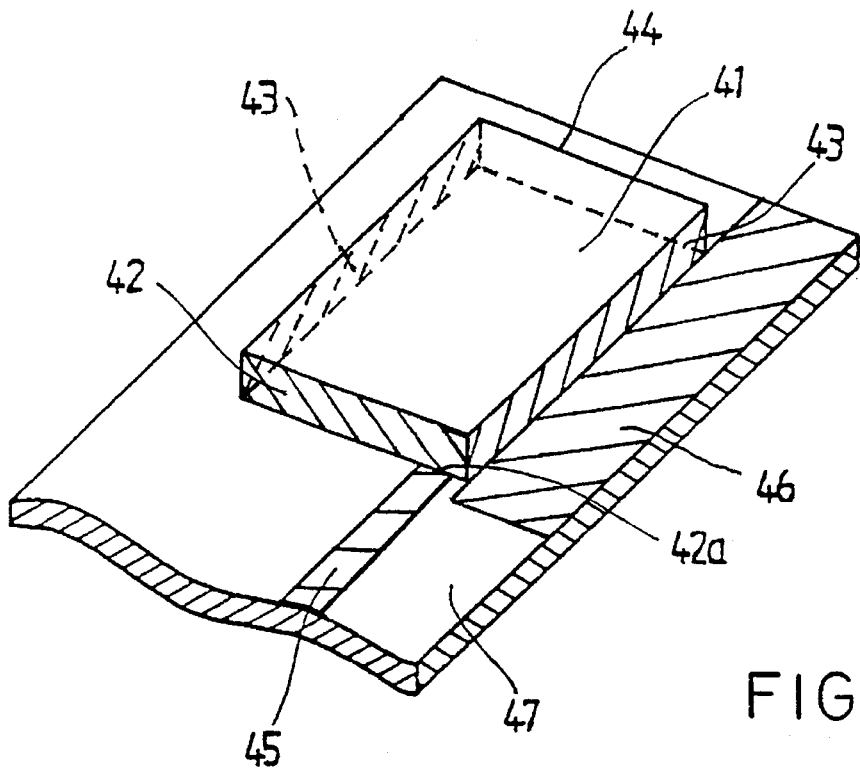
FIG. 6 is a perspective view showing a surface-mount-type antenna according to a fifth embodiment of the present invention and a mounting structure for the antenna.

FIG. 6 shows an antenna 44 comprising: a dielectric substrate 41; a radiation electrode 42 formed on a shorter side surface of the dielectric substrate 41; and ground electrode 43 formed on both longer side surfaces of the dielectric substrate 41 and electrically connected to the radiation electrode 42. The antenna 44 is placed on a printed circuit board 47 having an electrode pattern 45 and a grounding electrode 46, and a feeding point 42a of the radiation electrode 42 and the ground electrode 43 are respectively soldered to the electrode pattern 45 and the grounding electrode 46, thereby surface-mounting the antenna 44 on the printed circuit board 47. As indicated by the arrow, the high-frequency current flowing through the radiation electrode 42 flows parallel to the surface of the printed circuit board 47. The location of the feeding point 42a is advantageously determined to obtain a desired input impedance for the antenna 44.

The antennas 34, 34a and 44 shown in FIGS. 4–6 can be fastened to the printed circuit boards 36, 36a and 47, respectively, by attaching the reverse sides of the antennas 34, 34a and 44 to the obverse sides of the printed circuit boards 36, 36a and 47 by means of an adhesive. It is also possible to form a stationary electrode (not shown) on the reverse side of each of the dielectric substrates and, at the same time, form a holding electrode (not shown) on the obverse side of each of the printed circuit boards 36, 36a and 47, soldering the stationary electrodes of the antennas 34, 34a and 44 to the holding electrodes of the printed circuit boards 36, 36a and 47, respectively, thereby enabling the antennas 34, 34a and 44 to be secured to the printed circuit boards 36, 36a and 47.

In each of the antennas 5, 5a, 34, 34a and 44, constructed as described above, the high-frequency current flowing through the radiation electrode flows parallel to the surface of the associated dielectric substrate, so that the effective length of these antennas decreases, thereby making it possible to obtain a very small size.

Figure 8:
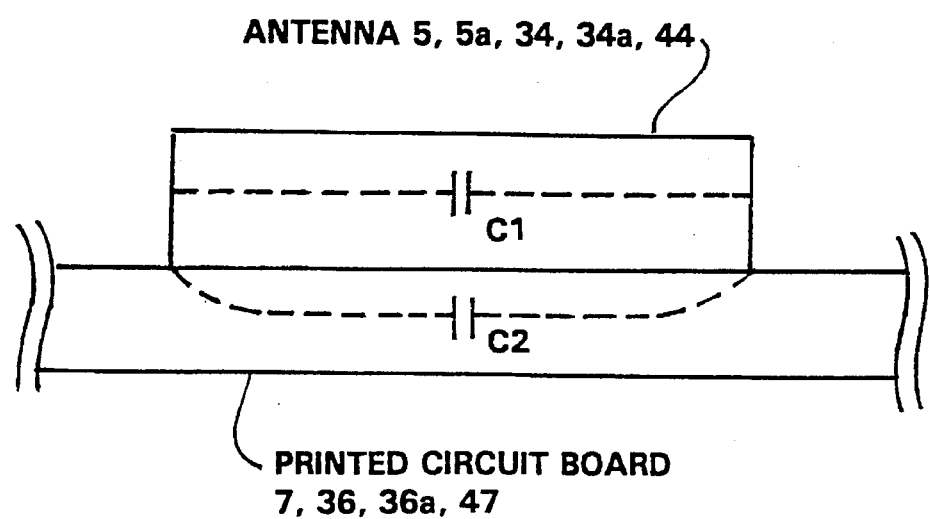
FIG. 8 is a schematic cross-sectional view illustrating a feature of the embodiments of FIGS. 1–6.
Figure 7:
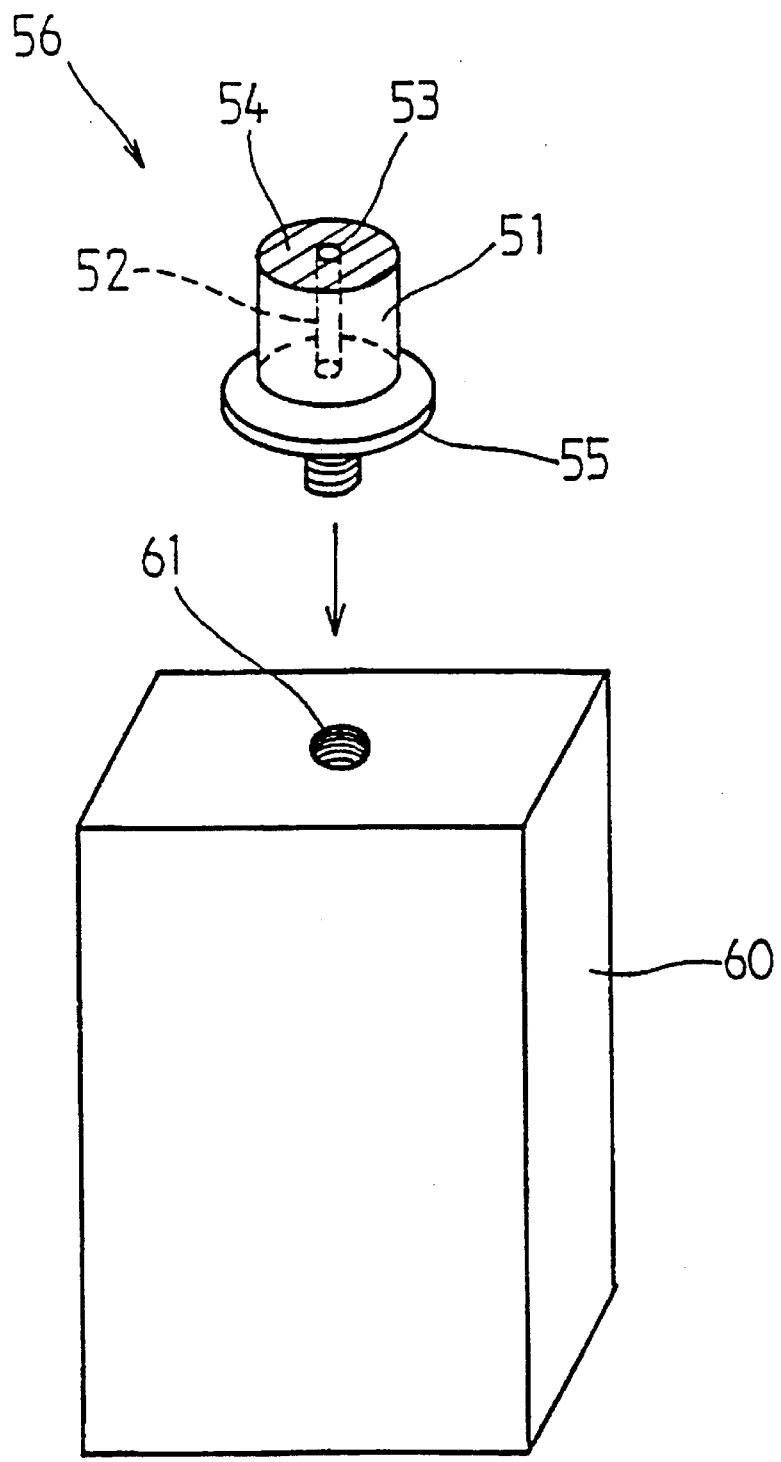
FIG. 7 is a perspective view showing a conventional antenna and a mounting structure for the antenna.

Further, as shown in FIG. 8, since in each antenna, the capacitance C2 of the printed circuit board combines with the capacitance C1 of the dielectric substrate of the antenna, the resonance frequency of each of the antennas 5, 5a, 34, 34a and 44 is lowered, thereby further permitting the size of the antenna to be reduced.

The dielectric substrates 1, 31 and 41 are mainly formed of a dielectric material as selected from Table 1. The dielectric constant of the material preferably ranges from 21 to 270.

TABLE 1

| Dielectric Material | |
| --- | --- |
| * MgTiO3-CaTiO3 | 21 |
| * Ba(Sn, Mg, Ta)O3 | 25 |
| * Ba(Sn, Nb)O3-Ba(Zn, Ta)O3 | 30 |
| * Ba(Zr, Zn, Ta)O3 | 30 |
| * (Ca, Sr, Ba)ZrO3 | 30 |
| * BaO-TiO2-WO3 | 37 |
| * (Zr, Sn)TiO4 | 38 |
| * BaTi9O20 | 40 |
| * BaO-Sm2O3-5TiO2 | 77 |
| * BaO-PbO-Nd2O3-TiO3 | 90 |
| * CaTiO3 | 180 |
| * SrTiO3 | 270 |

As described above, in the surface-mount-type antenna of the present invention and the mounting structure for the antenna, the feeding electrode of the antenna is formed on a side surface of the antenna, so that the antenna can be surface-mounted on a printed circuit board, thereby making it possible to attain a reduction in size of communication apparatuses. Further, since the antenna can be accommodated within the associated communication apparatus, no external forces are allowed to be directly applied to the antenna, thereby solving various problems in the prior art, for example, the deterioration in the mechanical strength and durability of the antenna, and the fluctuations in the characteristics thereof.

Further, since the circuit of the associated communication apparatus and the antenna can be connected to each other through the shortest distance possible, without using any connector, no increase in insertion loss, fluctuation of resonance frequency, etc. is generated, and it is possible to attain a reduction in the number of parts, cost, weight, and thickness. In addition, since the high-frequency current flowing through the radiation electrode flows parallel to the surface of the dielectric substrate, the effective length of the antenna decreases, thereby making it possible to obtain a very small size. Further, since the capacitance of the printed circuit board combines with the capacitance of the dielectric substrate of the antenna, the resonance frequency of the antenna is lowered, which further permits the size of the antenna to be reduced.

What is claimed is:

1. A surface-mount-type antenna comprising: a dielectric substrate having at least one major surface and at least a first side surface; a radiation electrode formed on a portion of said dielectric substrate; and a feeding electrode electrically connected to said radiation electrode and formed on said first side surface of said dielectric substrate;

wherein said radiation electrode is formed within the interior of said dielectric substrate and extending parallel to the major surface of said dielectric substrate, and wherein said dielectric substrate has a second side surface opposite said first side surface; a first side electrode formed on said second side surface and conductively connected to said radiation electrode; and a second side electrode formed on said first side surface; wherein said second side electrode provides a capacitance with said first side electrode.

2. A surface-mount-type antenna according to claim 1, further comprising a through-hole formed within the interior of said dielectric substrate and extending parallel to the major surface of said dielectric substrate, said radiation electrode being formed on an inner periphery of said through-hole.

3. In combination, a surface-mount-type antenna according to claim 1, and a printed circuit board having an electrode pattern, the major surface of the dielectric substrate being adhered to said printed circuit board and the feeding electrode being conductively adhered to said electrode pattern; and said second side electrode being conductively adhered to a grounding pattern on said printed circuit board.

4. In combination, a surface-mount-type antenna comprising: a dielectric substrate having a major surface and first and second perpendicular side surfaces; a radiation electrode formed on said first side surface of said dielectric substrate; and a ground electrode electrically connected to said radiation electrode and formed on said second side surface perpendicular to said radiation electrode; and a printed circuit board having an electrode pattern and a grounding pattern; a feeding point of the radiation electrode of said surface-mount-type antenna being conductively joined to the electrode pattern of the printed circuit board, and the ground electrode of said surface-mount-type antenna being conductively connected to the grounding pattern of the printed circuit board.

5. A combination according to any one of claims 3 and 4 wherein the surface-mount-type antenna is mounted on the printed circuit board so that the direction of a high-frequency current flowing through said radiation electrode is parallel to a major surface of the printed circuit board.

6. A surface-mount-type antenna according to claim 4, further comprising a second ground electrode electrically connected to said radiation electrode and formed on a third side surface perpendicular to said first side surface and opposite said second side surface.

7. A surface-mount-type antenna comprising: a dielectric substrate having at least one major surface and at least a first side surface; a radiation electrode formed on a portion of said dielectric substrate; and a feeding electrode electrically connected to said radiation electrode and formed on said first side surface of said dielectric substrate;

wherein said radiation electrode is formed within the interior of said dielectric substrate; and wherein said dielectric substrate has a second side surface opposite said first side surface; a first side electrode formed on said second side surface and conductively connected to said radiation electrode; and a second side electrode formed on said first side surface; wherein said second side electrode provides a capacitance with said first side electrode.

8. In combination, a surface-mount-type antenna according to claim 7, and a printed circuit board having an electrode pattern, the major surface of the dielectric substrate being adhered to said printed circuit board and the feeding electrode being conductively adhered to said electrode pattern; and said second side electrode being conductively adhered to a grounding pattern on said printed circuit board.

9. In combination, a surface-mount-type antenna comprising: a dielectric substrate having at least one major surface and at least a first side surface; a radiation electrode formed on a portion of said dielectric substrate; and a feeding electrode electrically connected to said radiation electrode and formed on said first side surface of said dielectric substrate;

wherein said radiation electrode is formed within the interior of said dielectric substrate; and a printed circuit board having an electrode pattern, the major surface of the dielectric substrate being adhered to said printed circuit board and the feeding electrode being conductively adhered to said electrode pattern.

10. The combination of claim 9, wherein said feeding electrode is arranged on said first side surface of said dielectric substrate such that said antenna is mountable on a printed circuit board having an electrode pattern, with the major surface being adjacent to said printed circuit board and the feeding electrode being adjacent to said electrode pattern.

11. In combination, a surface-mount-type antenna comprising: a dielectric substrate having at least one major surface and at least a first side surface; a radiation electrode formed on a portion of said dielectric substrate; and a feeding electrode electrically connected to said radiation electrode and formed on said first side surface of said dielectric substrate;

further comprising a through-hole formed within the interior of said dielectric substrate and extending along the major surface of said dielectric substrate, said radiation electrode being formed on an inner periphery of said through-hole; and a printed circuit board having an electrode pattern, the major surface of the dielectric substrate being adhered to said printed circuit board and the feeding electrode being conductively adhered to said electrode pattern.

12. The combination of claim 11, wherein said feeding electrode is arranged on said first side surface of said dielectric substrate such that said antenna is mountable on a printed circuit board having an electrode pattern, with the major surface being adjacent to said printed circuit board and the feeding electrode being adjacent to said electrode pattern.

13. A surface-mount-type antenna comprising: a dielectric substrate having at least one major surface and at least a first side surface; a radiation electrode formed on a portion of said dielectric substrate; and a feeding electrode electrically connected to said radiation electrode and formed on said first side surface of said dielectric substrate;

further comprising a through-hole formed within the interior of said dielectric substrate and extending parallel to the major surface of said dielectric substrate, said radiation electrode being formed on an inner periphery of said through-hole;

wherein said dielectric substrate has a second side surface opposite said first side surface; a first side electrode formed on said second side surface and conductively connected to said radiation electrode; and a second side electrode formed on said first side surface; wherein said second side electrode provides a capacitance with said first side electrode.

14. In combination, a surface-mount-type antenna according to claim 13, and a printed circuit board having an electrode pattern, the major surface of the dielectric substrate being adhered to said printed circuit board and the feeding electrode being conductively adhered to said electrode pattern; and said second side electrode being conductively adhered to a grounding pattern on said printed circuit board.

* * * * *